(12) United States Patent
Ng et al.

(10) Patent No.: US 8,300,125 B2
(45) Date of Patent: Oct. 30, 2012

(54) METHOD AND APPARATUS FOR USING THIN-FILM TRANSISTORS AND MIS CAPACITORS AS LIGHT-SENSING ELEMENTS IN CHARGE MAPPING ARRAYS

(75) Inventors: Tse Nga Ng, Palo Alto, CA (US); Sanjiv Sambandan, Palo Alto, CA (US); William S. Wong, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 1038 days.

(21) Appl. No.: 12/235,534

(22) Filed: Sep. 22, 2008

(65) Prior Publication Data

US 2010/0073530 A1   Mar. 25, 2010

(51) Int. Cl.
*H04N 3/14* (2006.01)
(52) U.S. Cl. .................... 348/294; 257/225
(58) Field of Classification Search ............ 348/294, 348/308, 302; 257/215, 225, 257, 290, 444
See application file for complete search history.

(56) References Cited

U.S. PATENT DOCUMENTS

| 7,719,583 B1* | 5/2010 | Lee et al. ............ 348/294 |
| 2007/0046619 A1* | 3/2007 | Sano et al. ........... 345/102 |
| 2008/0136947 A1* | 6/2008 | Baer ................... 348/294 |
| 2008/0198143 A1* | 8/2008 | Kinoshita et al. ..... 345/175 |

OTHER PUBLICATIONS

Light-Induced Bias Stress Reversal in Polyfluorene Thin-Film Transistors, Authors, A. Salleo and R.A. Street, Journal of Applied Physics, vol. 94, No. 1, Jul. 1, 2003.

Tse Nga Ng, William S. Wong, et al., "Flexible Image Sensor Array with Bulk Heterojunction Organic Photodiode", Applied Physics Letters, May 28, 2008, Issue 92., American Institute of Physics.

Tse Nga Ng, Rene A. Lujan, et al., "Low Temperature a-Si: H Photodiodes and Flexible Image Sensor Arrays Patterns by Digital Lithography", Applied Physics Letters, Aug. 8, 2007, Issue 91, American Institute of Physics.

Tse Nga Ng, William S. Wong, et al., "Characterization of Charge Collection in Photodiodes under Mechanical Straing: Comparison between Organic Bulk Heterojunction and Amorphous Silicon", Advanced Materials, 2009, pp. 1855-1859, Issue 21, Wiley InterScience.

\* cited by examiner

*Primary Examiner* — Scott J Sugarman
*Assistant Examiner* — Vipin Patel
(74) *Attorney, Agent, or Firm* — Marger Johnson & McCollom PC

(57) ABSTRACT

A method and apparatus for using TFT transistors or MIS capacitors as light-sensing elements in charge mapping arrays. A bias stress may be applied to a plurality of pixels in a charge map array. As a result, charge carriers may be trapped in each of the plurality of pixels responsive to the bias stress, which may be observed as a value shift such as a threshold voltage $V_T$ shift. Light may then be transmitted toward the plurality of pixels in the charge map array causing some of the pixels to absorb the light. The trapped charge carriers are released in the pixels that absorbed the light and not released in the pixels that did not absorb the light. The value shift in each of the pixels can be compared to determine which of the pixels absorbed the light.

10 Claims, 14 Drawing Sheets

FIG. 3

METHOD AND APPARATUS FOR USING THIN-FILM TRANSISTORS AND MIS CAPACITORS AS LIGHT-SENSING ELEMENTS IN CHARGE MAPPING ARRAYS

BACKGROUND

Conventional organic photosensors rely on the extraction of photogenerated charges for signal detection. Organic photosensitive materials typically show low efficiency because the photogenerated charges are not able to reach electrodes due to charge trapping and recombination. Generally, photosensors are devices with p-n junctions at which the photogenerated charges (i.e., electron-hole pairs) separate and drift toward the electrodes. However, because of severe recombination problems that exist in current organic photosensors, fewer photogenerated charges arrive at the electrodes, and therefore fewer photogenerated charges can be extracted. As a result, the photosensors exhibit decreased efficiency.

A charge map array may include an array of photosensors. Information can be extracted from the array of photosensors to create a charge map image. The operation of each of the photosensors in a charge map array conventionally depends on the total amount of photogenerated charges that can be extracted from the photosensors. The amount of photogenerated charges that can be extracted from the photosensors can be affected by defects in the photosensitive materials or other operational characteristics of the organic materials that are used. In other words, if some or all of the photosensors of the charge map array exhibit poor performance characteristics such as low efficiency, then line defects or point defects can appear in the charge map image.

While the use of organic photosensitive materials in charge mapping arrays provides certain benefits such as cost and flexibility over the use of non-organic materials, efficiency and accuracy of the charge map image may suffer as a result.

DETAILED DESCRIPTION OF THE EMBODIMENTS

Embodiments of the present invention take advantage of charge trapping and recombination in organic materials. Organic materials are potentially low cost and can be easily integrated onto flexible platforms. A charge map array may include a two-dimensional array of pixels. Each pixel may include a Thin Film Transistor (TFT) switching element and one of a TFT light sensing element or a Metal Insulator Semiconductor (MIS) capacitor light sensing element. Measuring a value shift in the light sensing element caused by the light-induced recombination may allow detection of light. The value shift may consist of a threshold voltage $V_T$ shift or a capacitance shift. Application of a bias stress to each of the pixels in the charge map array traps charge carriers in the light sensing element causing the value shift. Transmission of light may occur after application of the bias stress.

Some pixels of the charge map array may absorb light causing a release of the trapped charge carriers and reversing the value shift in the pixels that have absorbed the light. A data sense board may then read information from the pixels and compare the information to determine which of the pixels in the charge map array absorbed the transmitted light and which of the pixels in the charge map array did not absorb the light. A relative change in trapped charges may be detected to determine which pixels absorbed the light. As a result, the data sense board may observe the relative change in trapped charges as a relative change in threshold voltage $V_T$, which can be detected. By detecting the relative change in the threshold voltage $V_T$ rather than depending on the extraction of photogenerated charges, non-uniformities across light sensing elements can be nulled out, enabling low-cost printing methods, which may be used to fabricate defect-tolerant image sensing devices or light sensor arrays. Thus, embodiments of the present invention are not dependent on the extraction of photogenerated charges, but rather on the relative change in trapped charges induced by light absorption.

Figure 1:
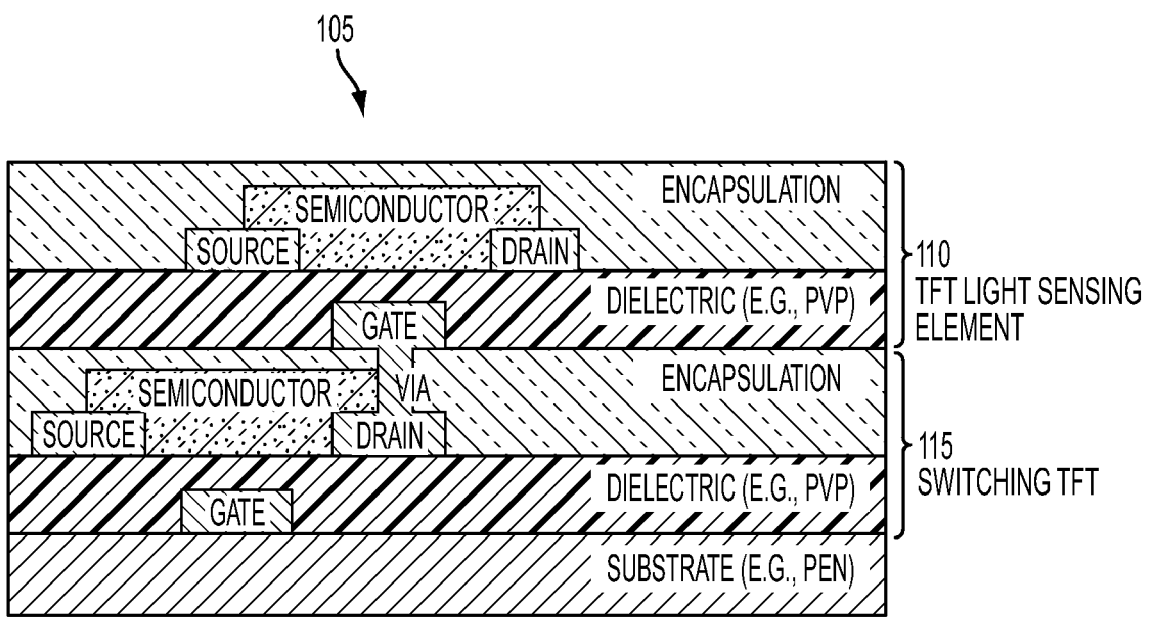
FIGS. 1-3 show an example of a pixel absorbing light according to an embodiment of the present invention.
Figure 2:
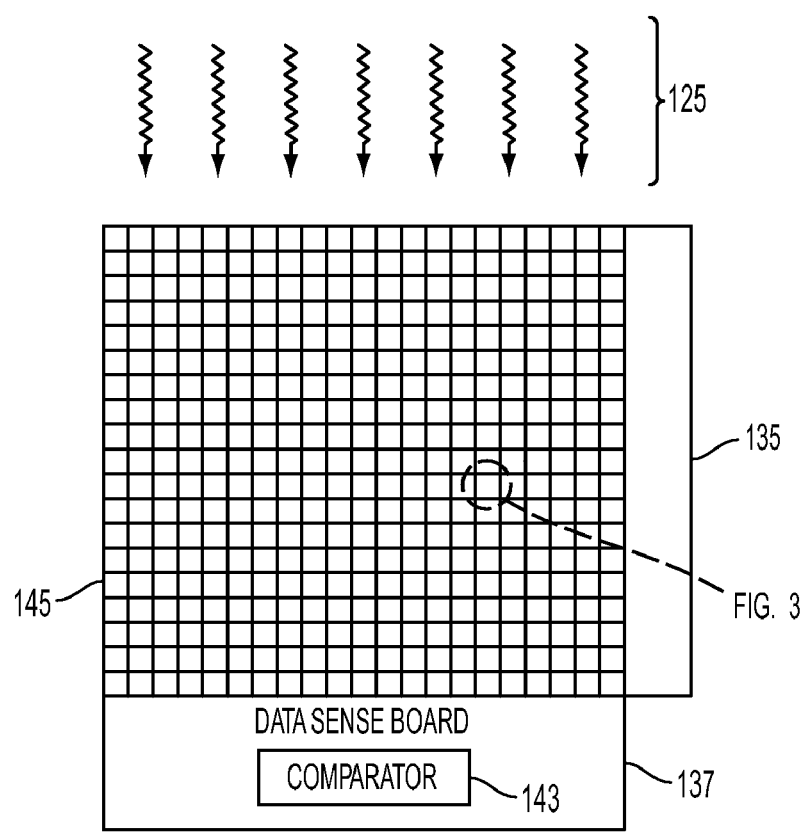
Figure 3:
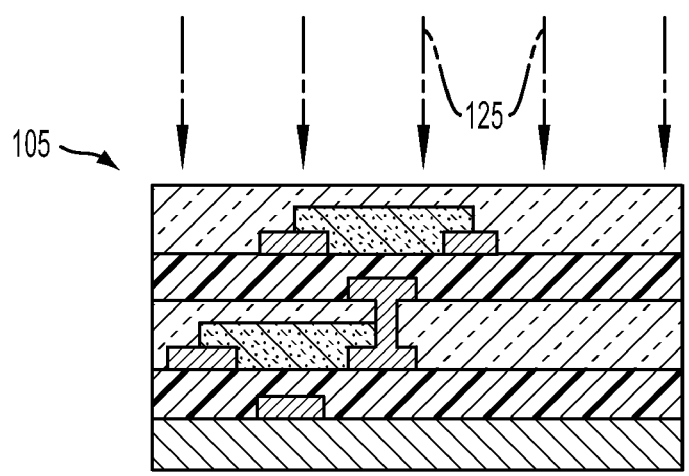
Figure 4:
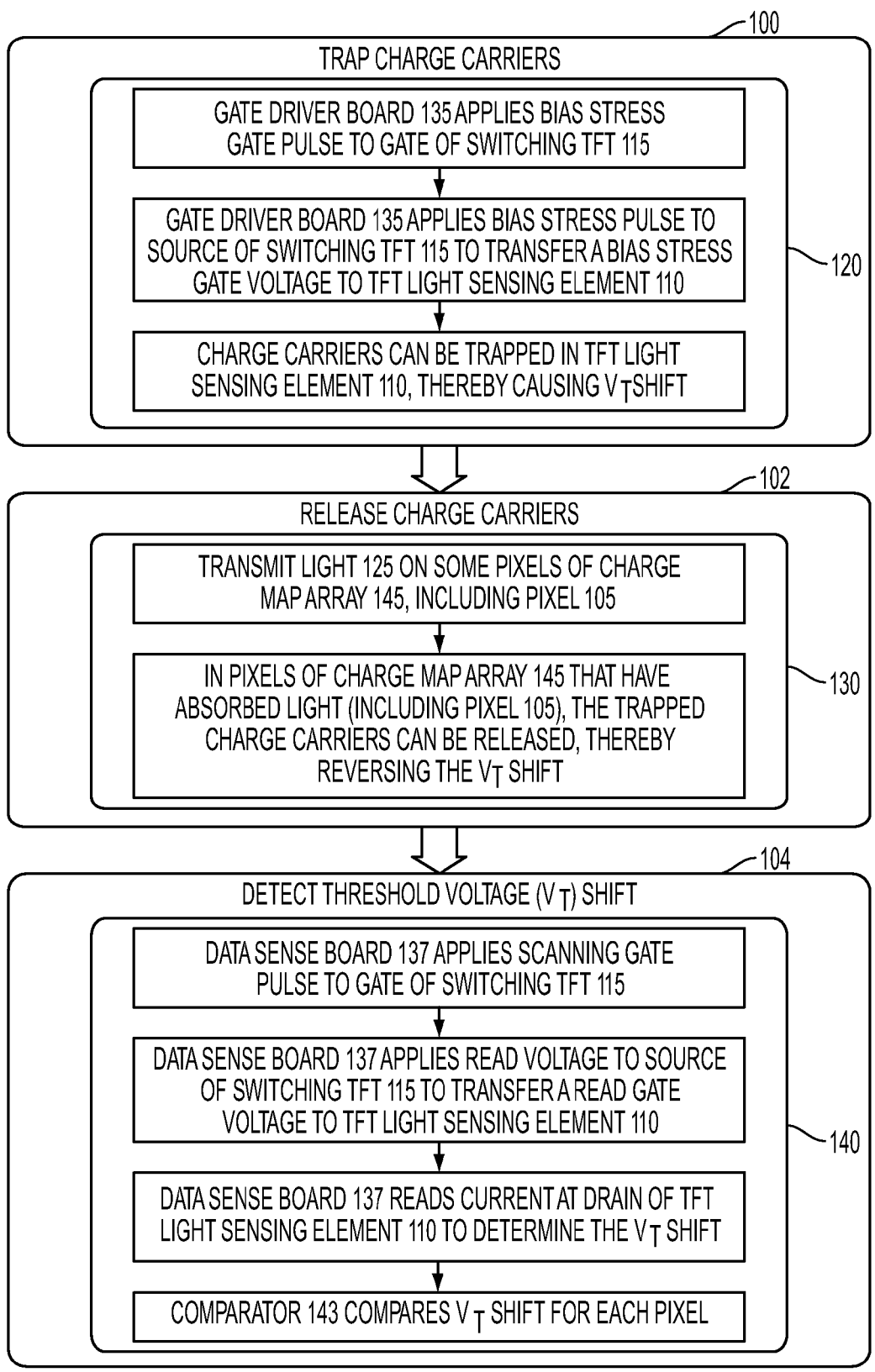
FIG. 4 shows a flow diagram illustrating trapping and releasing of charge carriers, and a detection of a threshold voltage shift in the pixel of FIGS. 1-3.

FIGS. 1-3 show an example of a pixel 105 absorbing light 125, according to an embodiment of the present invention. FIG. 4 shows a flow diagram illustrating trapping 100 and releasing 102 of charge carriers, and a detection 104 of a threshold voltage shift in the pixel 105 of FIGS. 1-3. According to aspects illustrated herein, reference will be made to features of FIGS. 1-4.

Pixel 105 may include a TFT light sensing element 110 and a switching TFT 115. The TFT light sensing element 110 may be exposed to light 125. Conversely, the switching TFT 115 is not exposed to light. Specifically, pixel 105 may include various layers including a substrate, a first dielectric layer, a first encapsulation layer, a second dielectric layer, and a second encapsulation layer. The substrate may comprise, for example, polyethylene naphthalate (PEN) and the first and second dielectric layers may comprise, for example, polyvinylphenol (PVP).

The first dielectric layer may be disposed over a gate of the switching TFT 115. The first encapsulation layer may be disposed over the source, drain, and semiconductor material of the switching TFT 115. A via may operatively couple the drain of the switching TFT 115 to a gate of the TFT light sensing element 110. The second dielectric layer may be disposed over the gate of the TFT light sensing element 110. The second encapsulation layer may be disposed over a source, drain, and semiconductor material of the TFT light sensing element 110.

At 100, pixel 105 or other pixels included in charge map array 145 may trap charge carriers. Specifically, a gate driver board 135 may apply a bias stress to pixels, including pixel 105, in the charge map array 145. For example, the gate driver board 135 may apply a bias stress gate pulse to the gate of the switching TFT 115 at 120, as shown in FIG. 4. Then, the gate driver board 135 may apply a bias stress pulse to the source of the switching TFT 115 to transfer a bias stress gate voltage to the TFT light sensing element 110. Charge carriers can then be trapped in the TFT light sensing element 110, thereby causing a threshold voltage $V_T$ shift. While only pixel 105 is described at 100, a similar bias stress procedure can be performed on each of a plurality of pixels in the charge map array 145. The trapping of the charge carriers may occur in each of the pixels of the charge map array 145 responsive to the bias stress.

When releasing charge carriers at 102, a transmission of light 125 may occur. For example, light 125 may be transmitted toward pixels in the charge map array 145. The charge map array 145 may include a plurality of pixels, each pixel including a switching element and a light sensing element structured to absorb light. The charge map array 145 may include the gate driver board 135 and a data sense board 137. The gate driver board 135 may be operatively coupled to the charge map array 145 and structured to apply a bias stress to each of the pixels in the charge map array, as discussed above. The data sense board 137 may be operatively coupled to the charge map array 145 and structured to determine the value shift in first and second portions of the pixels responsive to the transmission of light toward the pixels in the charge map array 145, as further described below.

The transmission of light 125 may cause the trapped charge carriers to be released in the first portion of the pixels. The second portion of pixels may not absorb light 125 from the transmission of light, and therefore, the trapped charge carriers for these pixels will remain trapped. There may also be more than two portions of pixels that either absorb light or don't absorb light, or that have light absorption ranges that vary, as later described with respect to Red Green Blue (RGB) light sensing elements. While only pixel 105 is described at 102, a similar procedure can be performed for each of the pixels in the pixel array 145.

At 130, light 125 may be transmitted on some pixels of charge map array 145, including pixel 105. In pixels of the charge map array 145 that have absorbed light (including, for example, pixel 105), the trapped charge carriers can be released, thereby reversing the threshold voltage $V_T$ shift. In pixels of the charge map array 145 that have not absorbed light, the trapped charge carriers are not released, and therefore, the threshold voltage $V_T$ shift is not reversed.

At 104, the value shift (such as the threshold voltage $V_T$ shift) can be detected. For example, the threshold voltage $V_T$ shift may be determined in the first portion and the second portion of the pixels. The comparator 143 may compare the threshold voltage $V_T$ shift in the first portion of pixels to the threshold voltage $V_T$ shift in the second portion of pixels. The data sense board 137 may then determine which of the pixels in the charge map array 145 absorbed the transmitted light based on the comparison of the threshold voltage $V_T$ shift in the first and second portions of the pixels.

Determining the threshold voltage $V_T$ shift in the first portion and second portion of the pixels may include applying a scanning gate pulse at 140 to a gate of the switching TFT 115 of each of the pixels in the charge map array 145. The data sense board 137 may apply the scanning gate pulse, and may also read measurement values, such as current values, from the TFT light sensing element 110 of each of the pixels in the charge map array 145. After applying the scanning gate pulse, the data sense board 137 may apply a read voltage to a source of the switching TFT 115 to transfer a read gate voltage to the TFT light sensing element 110.

The data sense board 137 may read a current value from a source or drain of the TFT light sensing element 110 to determine the threshold voltage $V_T$ shift. While only pixel 105 is described at 104, a similar procedure can be performed for each of the pixels in the pixel array 145. The data sense board 137 may include a comparator 143 to compare the threshold voltage $V_T$ shift in the first portion of the pixels to the threshold voltage $V_T$ shift in the second portion of the pixels to determine which of the plurality of pixels in the charge map array 145 absorbed the transmitted light 125. For example, the comparator 143 may compare the threshold voltage $V_T$ shift for each pixel. Moreover, the data sense board 137 may be structured to determine which of the plurality of pixels in the charge map array 145 absorbed the transmitted light 125 based on the comparison of the threshold voltage $V_T$ shift in the first and second portions of the pixels. Thus, pixels that have absorbed light (such as pixel 105) will have a different stored charge readout (as observed by the current value) compared to pixels that were in the dark.

Figure 5:
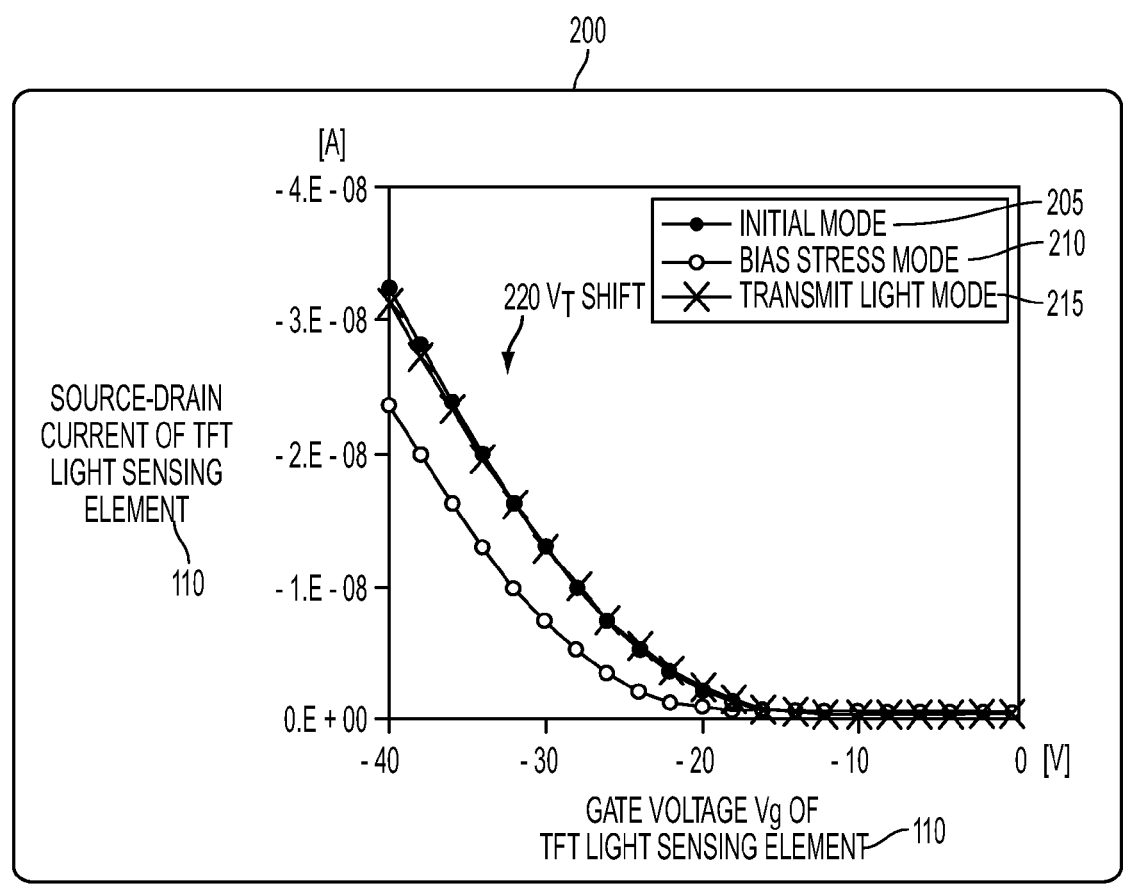
FIG. 5 shows a graph of source-drain current versus gate voltage of a TFT light sensing element for an initial mode, a bias stress mode, and a transmit light mode.

FIG. 5 shows a graph 200 of source-drain current versus gate voltage of a TFT light sensing element 110 for an initial mode 205, a bias stress mode 210, and a transmit light mode 215. The graph 200 illustrates an example of a threshold voltage $V_T$ shift plotted among an x-axis (gate voltage $V_g$ of TFT light sensing element 110) and a y-axis (source-drain current of TFT light sensing element 110). Organic materials are electrically unstable and have material band-gaps that are in the visible light range. The electrical instability of organic based devices result in large a threshold voltage shift when the device is operated at an applied bias stress. The initial mode 205 indicates a state prior to applying the bias stress. The bias stress mode 210 indicates a state where each pixel receives a bias stress by turning "on" the switching TFT (e.g., switching TFT 115 of FIG. 1) so that a bias stress is applied onto each TFT light sensing element (e.g., TFT light sensing element 110 of FIG. 1). The applied bias stress results in charge trapping, which may be observed as a shift in the threshold voltage $V_T$, as shown in FIG. 5. Subsequently, during a transmit light mode 215, light can be absorbed by the organic semiconductor, which causes photogenerated charges to recombine with the trapped charges. As a result, the threshold voltage $V_T$ shift may be reversed. The change in the source-drain current of the TFT light sensing element 110 is an indicator of the threshold voltage $V_T$ shift.

Figure 6:
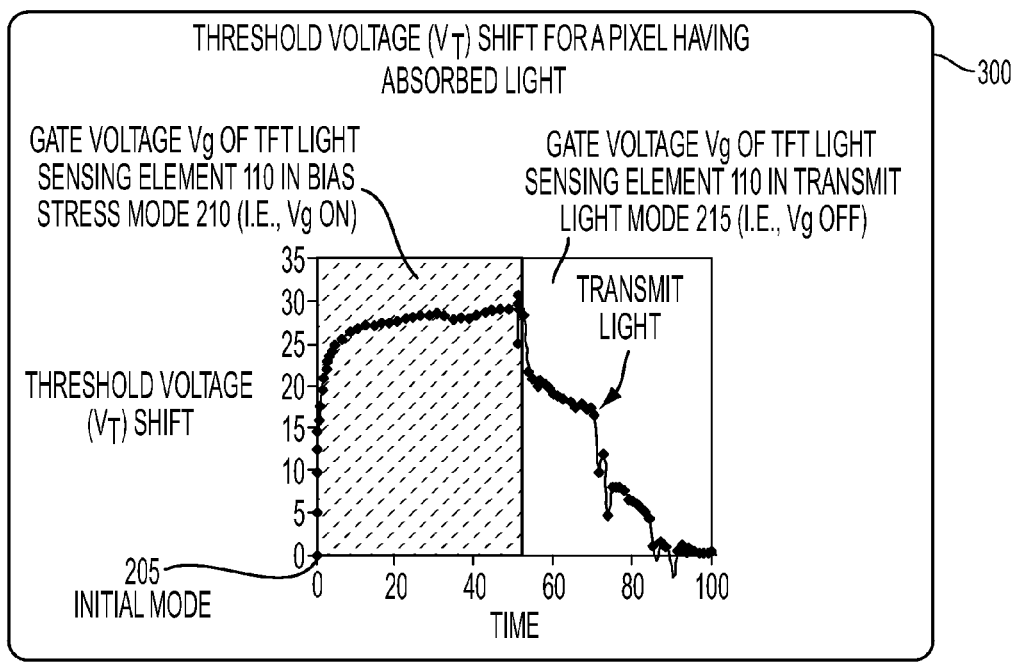
FIG. 6 shows a graph of threshold voltage $V_T$ shift versus time for a pixel having absorbed light.

FIG. 6 shows a graph 300 of threshold voltage $V_T$ shift versus time for a pixel having absorbed light. The time scale may represent seconds or milliseconds depending on the application or the desired responsiveness. The initial mode 205 indicates a state prior to applying the bias stress. The bias stress mode 210 indicates a state where each pixel receives a bias stress by turning "on" the switching TFT (e.g., switching TFT 115 of FIG. 1) so that a bias stress is applied onto each TFT light sensing element (e.g., TFT light sensing element 110 of FIG. 1). In other words, a gate voltage $V_g$ of the TFT light sensing element 110 may have an "on" state during the bias stress mode 210.

The applied bias stress results in charge trapping, which may be observed as a shift in the threshold voltage $V_T$, as shown in FIG. 6. The gate voltage $V_g$ of the TFT light sensing element 110 may have an "off" state during the transmit light mode 215. Sometime during the transmit light mode 215, a light transmission may occur. The light may be transmitted toward the pixels in the charge map array 145 (of FIG. 2). As an example, as much as 5V of threshold voltage $V_T$ shift reversal may result within 1 second of shining light onto the TFT light sensing element 110. In one embodiment, the photo-efficiency may be calculated to be ~1% at $V_g$=−30V and $V_{sd}$ (source-drain)=−10V.

Figure 7:
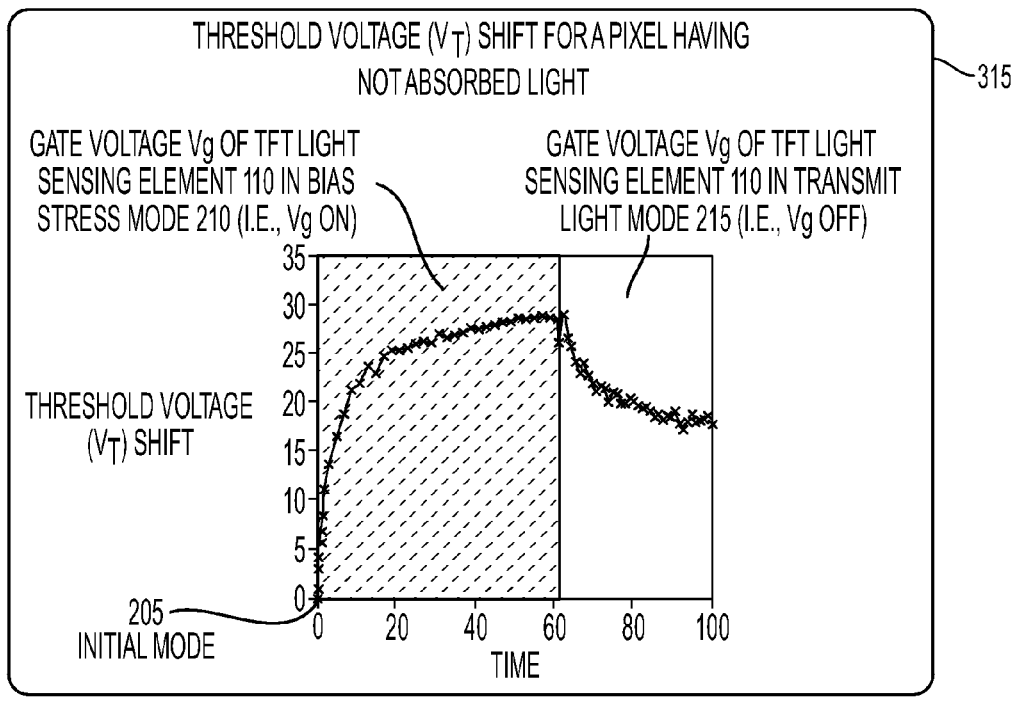
FIG. 7 shows a graph of threshold voltage $V_T$ shift versus time for a pixel having not absorbed light.

FIG. 7 shows a graph 315 of threshold voltage $V_T$ shift versus time for a pixel having not absorbed light. The time scale may represent seconds or milliseconds depending on the application or the desired responsiveness. The initial mode 205 indicates a state prior to applying the bias stress. The bias stress mode 210 indicates a state where each pixel receives a bias stress by turning "on" the switching TFT (e.g., switching TFT 115 of FIG. 1) so that a bias stress is applied onto each TFT light sensing element (e.g., TFT light sensing element 110 of FIG. 1). In other words, a gate voltage $V_g$ of the TFT light sensing element 110 may have an "on" state during the bias stress mode 210.

The applied bias stress results in charge trapping, which may be observed as a shift in the threshold voltage $V_T$, as shown in FIG. 7. The gate voltage $V_g$ of the TFT light sensing element 110 may have an "off" state during the transmit light mode 215. In contrast to FIG. 6, the transmit light mode 215 of FIG. 7 shows the behavior of a pixel that does not absorb light from the transmission of light. Even though the light may be transmitted toward the pixels in the charge map array 145 (of FIG. 2), only some of the pixels may actually absorb the light. In this case, FIG. 7 shows that the threshold voltage $V_T$ shift reversal does not occur and the trapped charges remain trapped.

Figure 8:
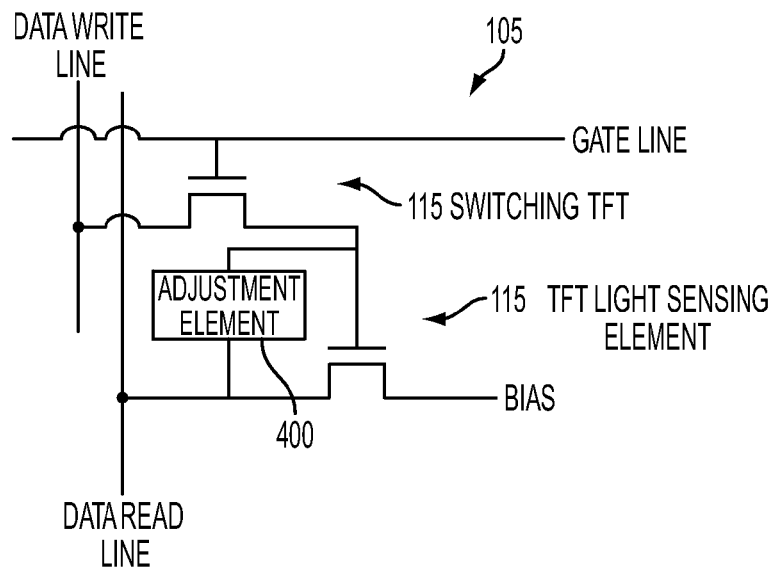
FIG. 8 shows a circuit diagram including an embodiment of a pixel including a TFT light sensing element, an adjustment element, and a switching TFT.

FIG. 8 shows a circuit diagram including an embodiment of the pixel 105 including the TFT light sensing element 110, an adjustment element 400, and the switching TFT 115. A gate of the switching TFT 115 may be operatively coupled to a gate line. A source of the switching TFT 115 may be operatively coupled to a data write line, and a drain of the switching TFT 115 may be operatively coupled to a gate of the TFT light sensing element 110. A source of the TFT light sensing element 110 may be operatively coupled to a bias, and a drain of the TFT light sensing element 110 may be operatively coupled to a data read line. The adjustment element 400 may be operatively coupled to both a gate and a drain of the TFT light sensing element 110. The adjustment element 400 may add a pixel hold time to enhance a threshold voltage $V_T$ shift. In one example embodiment, the adjustment element 400 can be a capacitor, and the hold time is RC, where R is from gate leakage of the TFT light sensing element 110 or the switching TFT 115, and C is the capacitance of the adjustment element 400. The operational characteristics including read/write and calibration cycles are later described with reference to FIG. 10.

Figure 9:
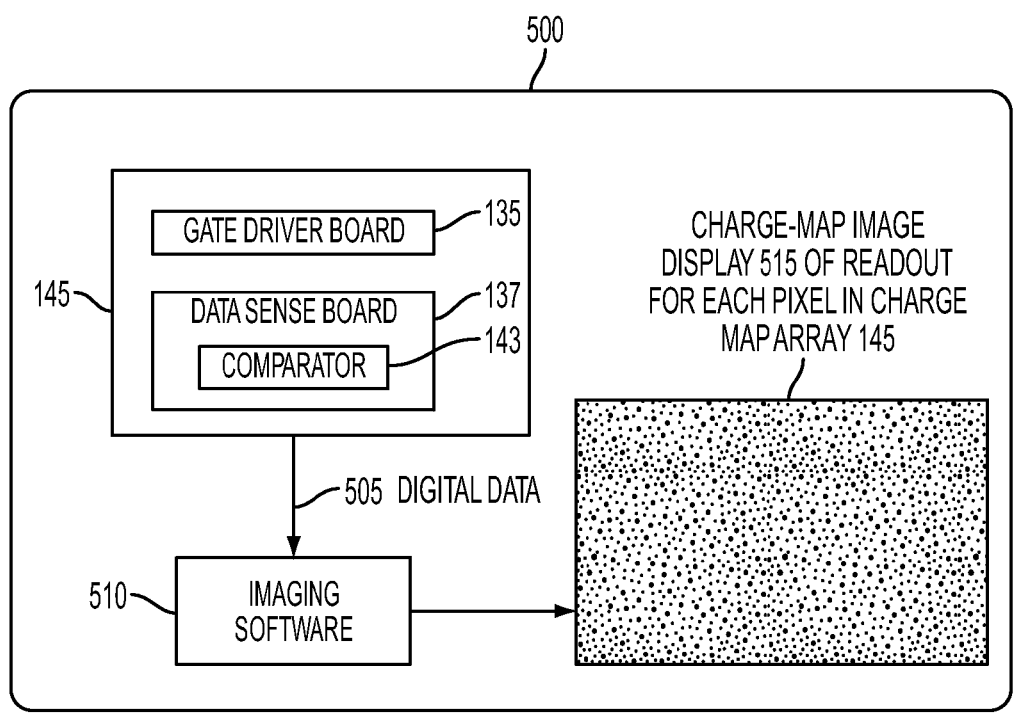
FIG. 9 shows an example of system having a charge map array including a gate driver board and a data sense board, and a flow of digital data to a charge map image display.

FIG. 9 shows an example of a system 500 having the charge map array 145 including a gate driver board 135 and a data sense board 137, and a flow of digital data 505 to imaging software 510, which provides a charge readout of each pixel to a charge map image display 515. The data sense board 137 may be structured to transmit digital data 505 to a display device such as the charge map image display 515, which may process a readout for each pixel in the charge map array 145. The charge map image display 515 may be structured to display an image based on the digital data 505 received from the data sense board 137. The digital data 505 may include pixel information such as the value shift in the first and second portions of the pixels of the pixel array 145. Imaging software 510 may be used to generate the image to be displayed on the charge map image display 515 responsive to the digital data 505.

The gate driver board 135 may be operatively coupled to the charge map array 145 and structured to apply a bias stress to the pixels in the charge map array 145. The data sense board 137 may be operatively coupled to the charge map array 145 and structured to determine the value shift in the first and second portions of the pixels responsive to a transmission of light toward the pixels in the charge map array 145. The data sense board 137 may include a comparator 143 to compare the value shift that is detected among the pixels of the charge map array 145. For example, the comparator 143 may compare the value shift in the first portion of the pixels to the value shift in the second portion of the pixels, as discussed above.

Due to the value shift (e.g., change in the threshold voltage $V_T$) of the pixels of the charge map array 145, the charge map array 145 will give a spatial image of the stored memory that can then be interpreted and converted to a light image on the charge map image display 515. The charge map image display 515 may accommodate a grayscale depth of 16 bits or more, and may also accommodate RGB images.

Figure 10:
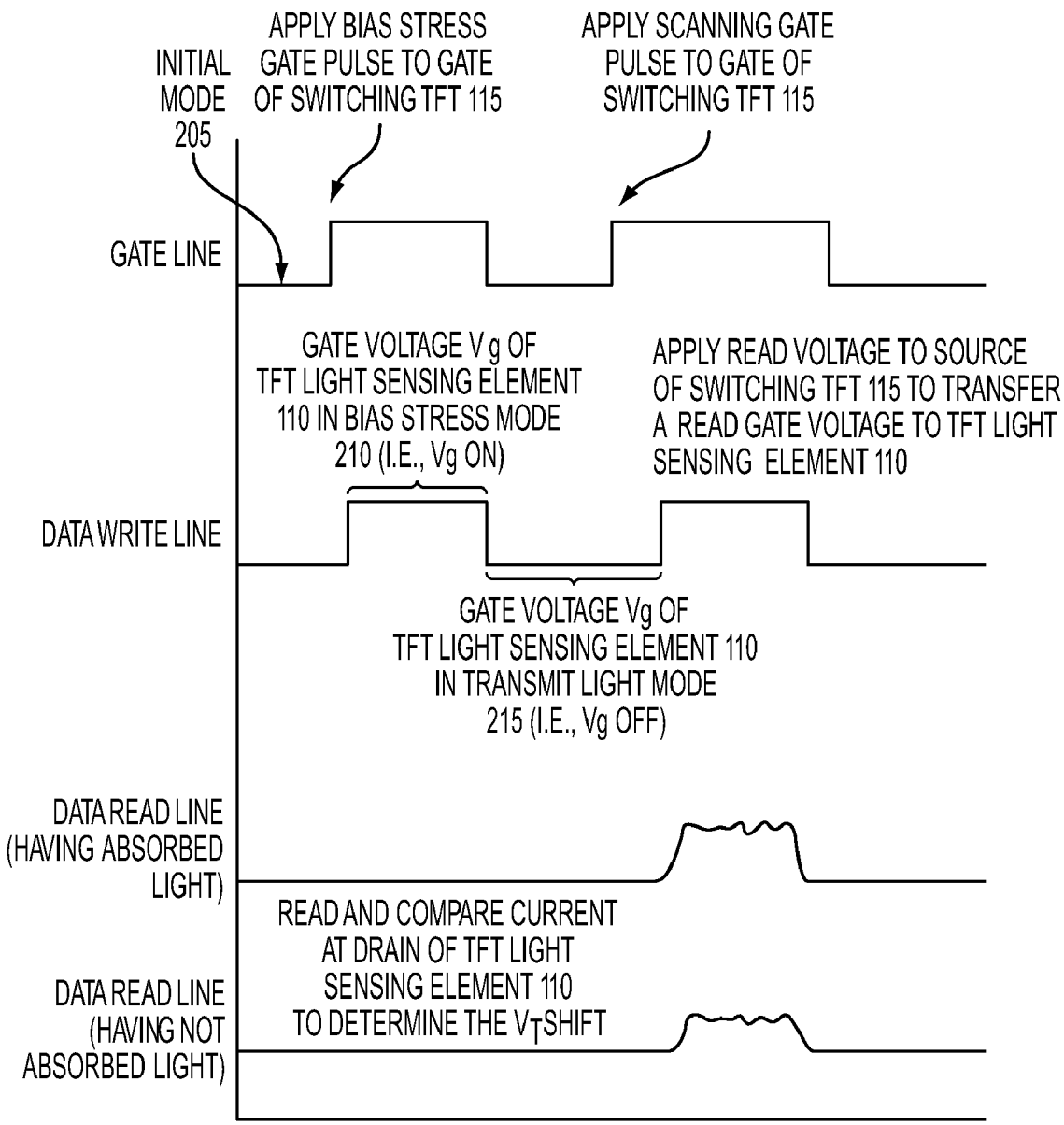
FIG. 10 shows a timing diagram of signals of a gate line, a data write line, and a data read line, associated with the operation of a pixel including a TFT light sensing element and switching TFT as illustrated in FIG. 8.

FIG. 10 shows a timing diagram of signals of a gate line, a data write line, and a data read line, associated with the operation of a pixel 105 including a TFT light sensing element 110 and switching TFT 115 as illustrated in FIG. 8.

A write cycle will first be described. At initial mode 205, both the gate line and the data write line are at a low level. A bias stress gate pulse may then be applied over the gate line to a gate of switching TFT 115. In the bias stress mode 210, a bias stress pulse may be applied over the write line through the switching TFT 115, thereby pulsing a gate voltage $V_g$ of the TFT light sensing element 110 to a high level (i.e., an "on" state). The gate voltage $V_g$ of the TFT light sensing element 110 may thereafter transition to a low level (i.e., an "off" state) at the end of the pulse.

After the gate voltage $V_g$ of the TFT light sensing element 110 has transitioned to a low level, a transmission of light occurs. In other words, light may be transmitted toward the pixels of the charge map array 145 (of FIG. 9) between the write cycle and a read cycle.

A read cycle will now be described. A scanning gate pulse may be applied over the gate line to a gate of the switching TFT 115 and a read voltage may be applied over the data write line to a source of the switching TFT 115 to transfer a read gate voltage to the TFT light sensing element 110. Current at the source or drain of the TFT light sensing element 110 may then be read and compared to determine the threshold voltage $V_T$ shift. In other words, a pixel having absorbed light will have a different current value than a pixel having not absorbed light, as shown toward the bottom of FIG. 10.

While an operation of a pixel including TFT light sensing element 110 and switching TFT 115 is herein described, similar operations can be performed on a plurality of similarly situated pixels. A calibration operation may also be periodically performed on each of the pixels of the charge map array 145. The calibration operation may occasionally write fixed voltage values for calibration of signal decay and threshold voltage $V_T$ shift non-linearity.

Figure 11:
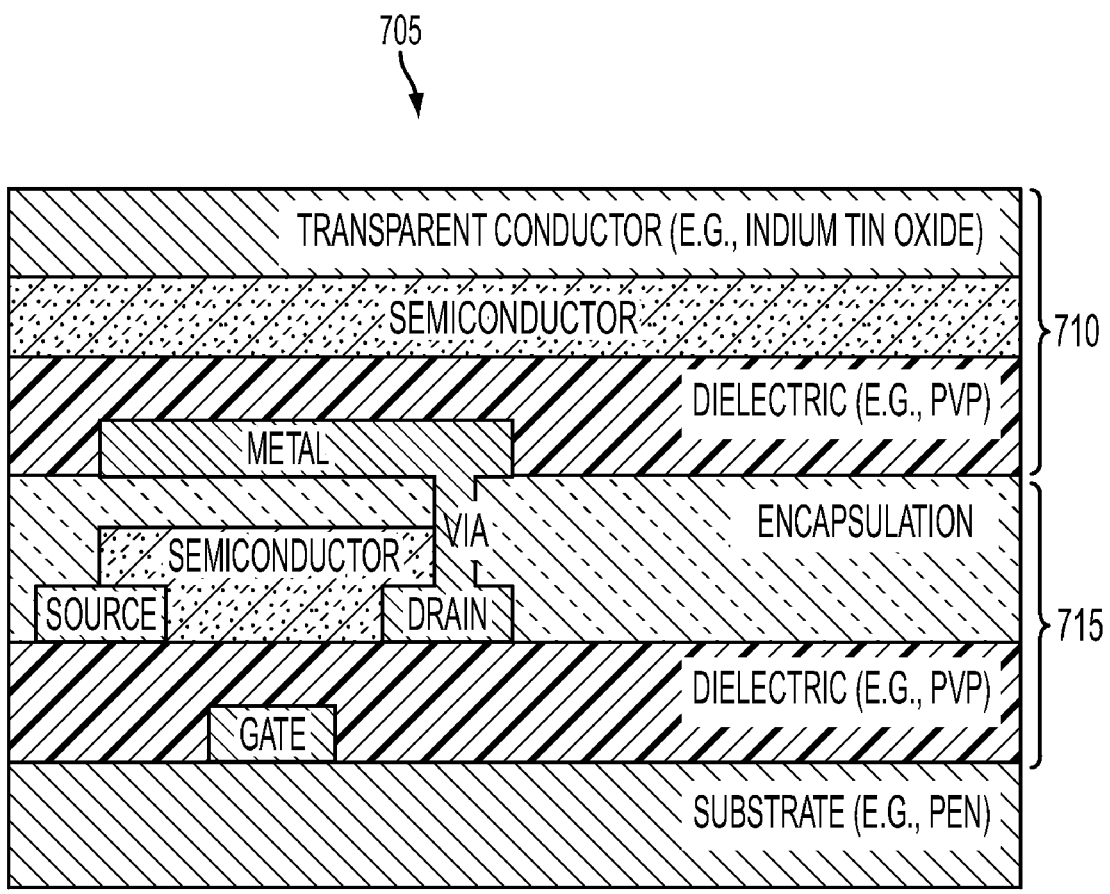
FIGS. 11-13 show an example of a pixel absorbing light, according to another embodiment of the present invention.
Figure 12:
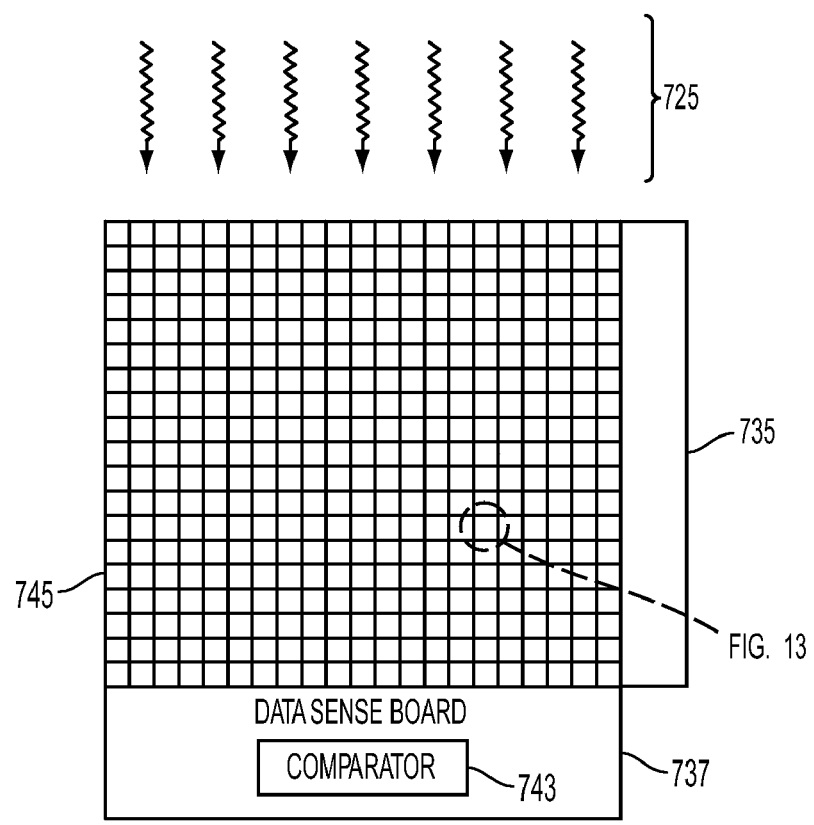
Figure 13:
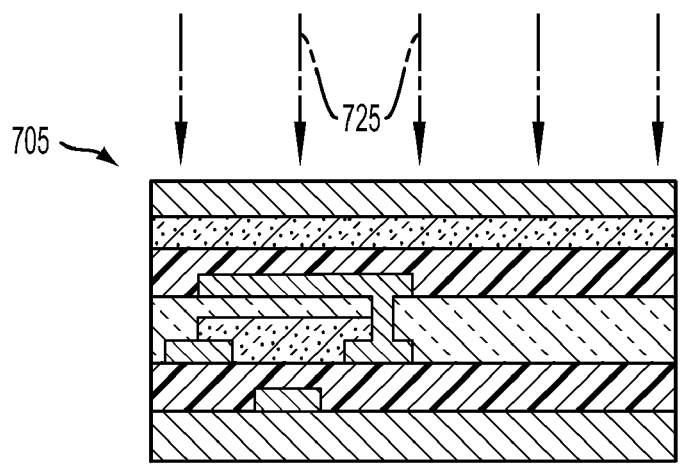
Figure 14:
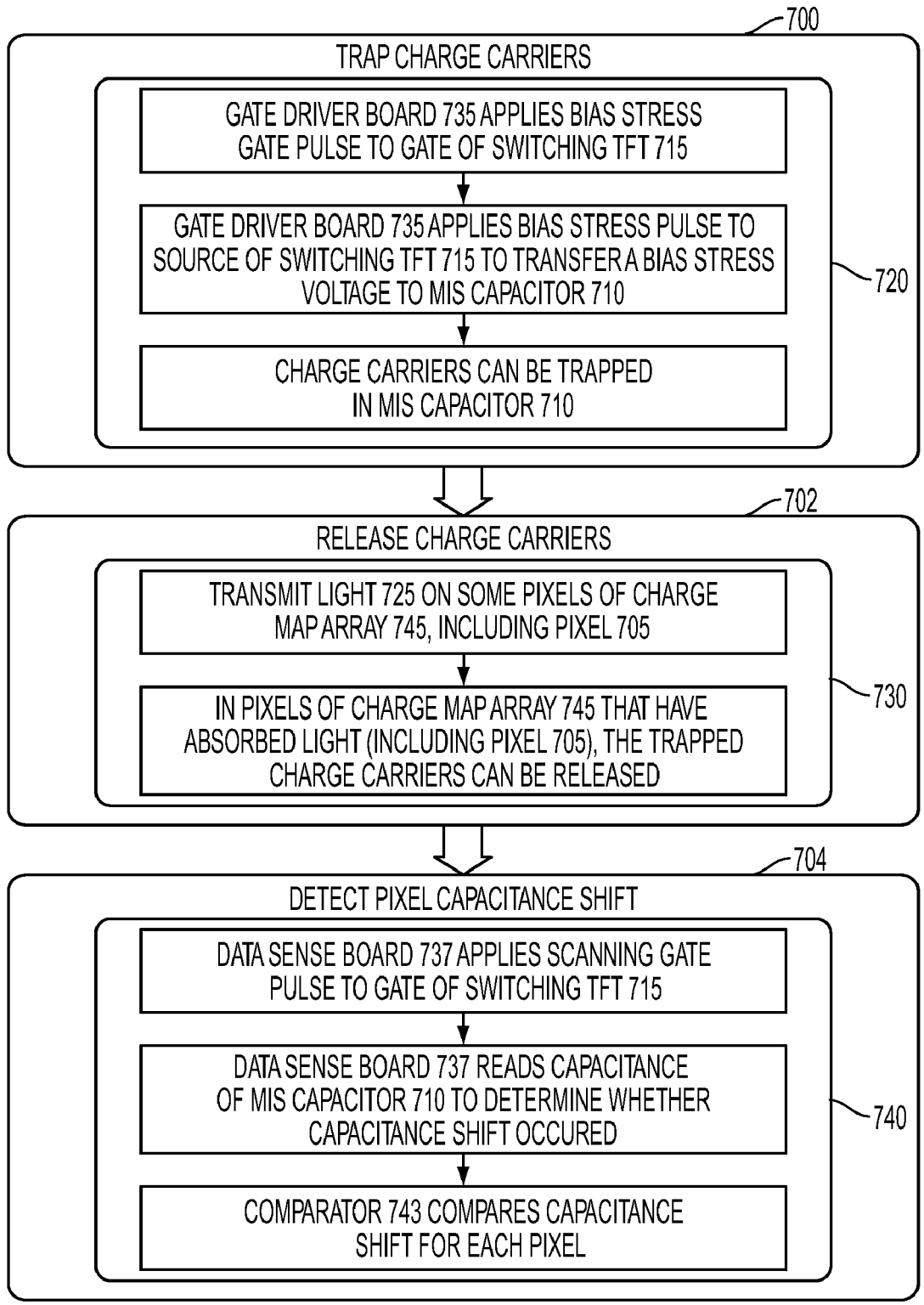
FIG. 14 shows a flow diagram illustrating trapping and releasing of charge carriers, and a detection of a capacitance shift in the pixel of FIGS. 11-13.

FIGS. 11-13 show an example of a pixel 705 absorbing light 725, according to another embodiment of the present invention. FIG. 14 shows a flow diagram illustrating trapping 700 and releasing 702 of charge carriers, and a detection 704 of a capacitance shift in the pixel 705 of FIGS. 11-13. According to aspects illustrated herein, reference will be made to features of FIGS. 11-14.

Pixel 705 may include a MIS capacitor light sensing element 710 and a switching TFT 715. The MIS capacitor light sensing element 710 may be exposed to light 725. Conversely, the switching TFT 715 is not exposed to light. Specifically, pixel 705 may include various layers including a substrate, a first dielectric layer, an encapsulation layer, a second dielectric layer, a semiconductor layer, and a transparent conductor layer. The substrate may comprise, for example, polyethylene naphthalate (PEN) and the first and second dielectric layers may comprise, for example, polyvinylphenol (PVP). Further, the transparent conductor layer may comprise, for example, indium tin oxide.

The first dielectric layer may be disposed over a gate of the switching TFT 715. The encapsulation layer may be disposed over the source, drain, and semiconductor material of the switching TFT 715. A via may operatively couple the drain of the switching TFT 715 to a metal portion of the MIS capacitor light sensing element 710. The second dielectric layer may be disposed over the metal portion of the MIS capacitor light sensing element 710. The semiconductor layer may be disposed over the second dielectric layer and the transparent conductor layer may be disposed over the semiconductor layer, thereby forming the MIS capacitor light sensing element 710.

At 700, pixel 705 or other pixels included in charge map array 745 may trap charge carriers. Specifically, a gate driver board 735 may apply a bias stress to pixels, including pixel 705, in the charge map array 745. For example, the gate driver board 135 may apply a bias stress gate pulse to the gate of the switching TFT 715 at 720, as shown in FIG. 14. Then, the gate driver board 135 may apply a bias stress pulse to the source of the switching TFT 715 to transfer a bias stress voltage to the MIS capacitor light sensing element 710. Charge carriers can then be trapped in the MIS capacitor light sensing element 710, thereby causing a capacitance shift. While only pixel 705 is described at 700, a similar bias stress procedure can be performed on each of a plurality of pixels in the charge map array 745. The trapping of the charge carriers may occur in each of the pixels of the charge map array 745 responsive to the bias stress.

When releasing charge carriers at 702, a transmission of light 725 may occur. For example, light 725 may be transmitted toward pixels in the charge map array 745. The charge map array 745 may include a plurality of pixels, each pixel including a switching element and a light sensing element structured to absorb light. The charge map array 745 may include the gate driver board 735 and a data sense board 737. The gate driver board 735 may be operatively coupled to the charge map array 745 and structured to apply a bias stress to each of the pixels in the charge map array, as discussed above. The data sense board 737 may be operatively coupled to the charge map array 745 and structured to determine the value shift in first and second portions of the pixels responsive to the transmission of light toward the pixels in the charge map array 745, as further described below.

The transmission of light 725 may cause the trapped charge carriers to be released in the first portion of the pixels. The second portion of pixels may not absorb light 725 from the transmission of light, and therefore, the trapped charge carriers for these pixels will remain trapped. There may also be more than two portions of pixels that either absorb light or don't absorb light, or that have light absorption ranges that vary, as later described with respect to Red Green Blue (RGB) light sensing elements. While only pixel 705 is described at 702, a similar procedure can be performed on each of a plurality of pixels in the charge map array 745.

At 730, light 725 may be transmitted on some pixels of charge map array 745, including pixel 705. In pixels of the charge map array 745 that have absorbed light (including, for example, pixel 705), the trapped charge carriers can be released, thereby reversing the capacitance shift. In pixels of the charge map array 745 that have not absorbed light, the trapped charge carriers are not released, and therefore, the capacitance shift is not reversed.

At 704, the value shift (such as the capacitance shift) can be detected. For example, the capacitance shift may be determined in the first portion and the second portion of the pixels. The comparator 743 may compare the capacitance shift in the first portion of pixels to the capacitance shift in the second portion of pixels. The data sense board 737 may then determine which of the pixels in the charge map array 745 absorbed the transmitted light based on the comparison of the capacitance shift in the first and second portions of the pixels.

Determining the capacitance shift in the first portion and second portion of the pixels may include applying a scanning gate pulse at 740 to a gate of the switching TFT 715 of each of the pixels in the charge map array 745. The data sense board 737 may apply the scanning gate pulse, and may also read measurement values, such as capacitance values, from the MIS capacitor light sensing element 710 of each of the pixels in the charge map array 745. After applying the scanning gate pulse, the data sense board 737 may apply a read voltage to a source of the switching TFT 715 to transfer a read gate voltage to the MIS capacitor light sensing element 710.

The data sense board 737 may read a capacitance value from the MIS capacitor light sensing element 710 to determine whether a capacitance shift has occurred. While only pixel 705 is described at 704, a similar procedure can be performed for each of the pixels in the pixel array 745. The data sense board 737 may include a comparator 743 to compare the capacitance shift in the first portion of the pixels to the capacitance shift in the second portion of the pixels to determine which of the plurality of pixels in the charge map array 745 absorbed the transmitted light 725. For example, the comparator 743 may compare the capacitance shift for each pixel. Moreover, the data sense board 737 may be structured to determine which of the plurality of pixels in the charge map array 745 absorbed the transmitted light 725 based on the comparison of the capacitance shift in the first and second portions of the pixels. Thus, pixels that have absorbed light (such as pixel 705) will have a different stored charge readout (as observed by the capacitance value) compared to pixels that were in the dark.

Figure 15:
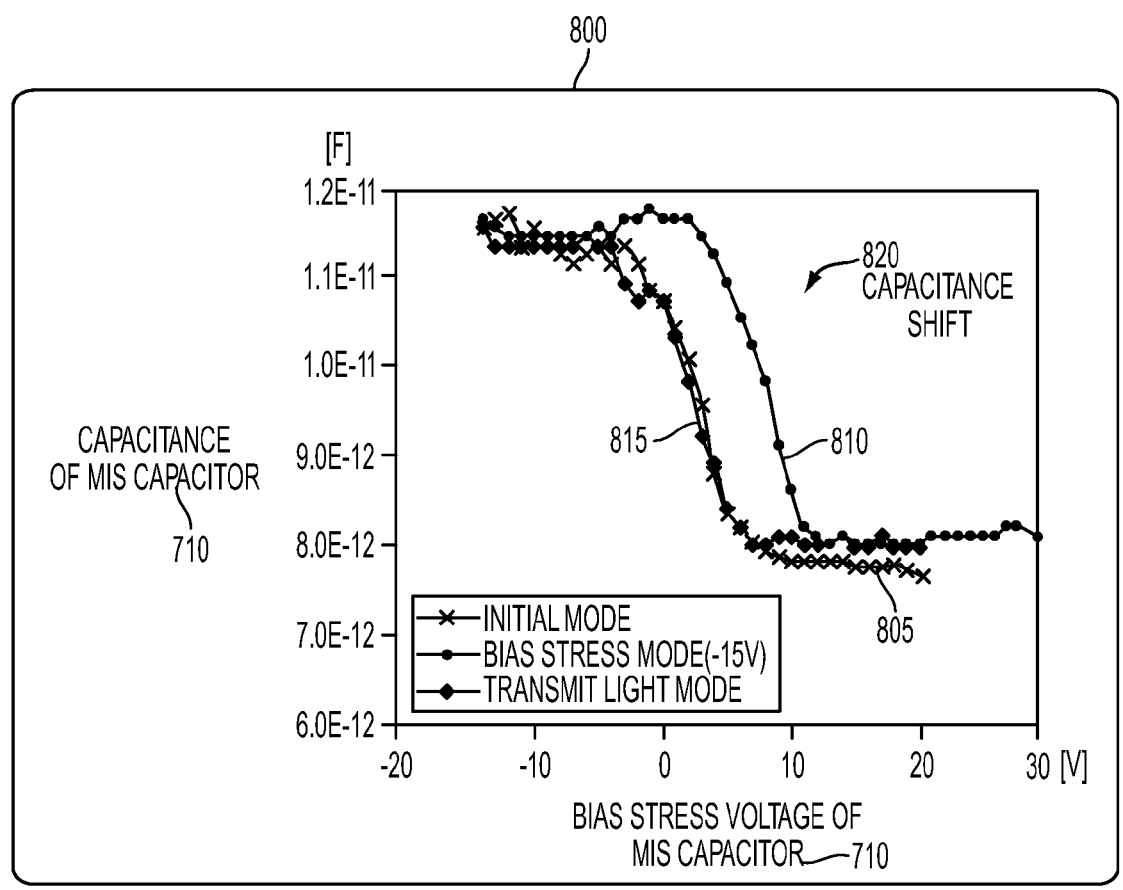
FIG. 15 shows a graph of capacitance of a MIS capacitor versus bias stress voltage of the MIS capacitor for an initial mode, a bias stress mode, and a transmit light mode.

FIG. 15 shows a graph 800 of capacitance of a MIS capacitor versus bias stress voltage of the MIS capacitor light sensing element 710 for an initial mode 805, a bias stress mode 810, and a transmit light mode 815. The graph 800 illustrates an example of a capacitance shift plotted among an x-axis (bias stress voltage of MIS capacitor light sensing element 710) and a y-axis (capacitance of MIS capacitor light sensing element 710). Organic materials are electrically unstable and have material band-gaps that are in the visible light range. The electrical instability of organic based devices result in large capacitance shift when the device is operated at an applied bias stress. The initial mode 805 indicates a state prior to applying the bias stress. The bias stress mode 810 indicates a state where each pixel receives a bias stress by turning "on" the switching TFT (e.g., switching TFT 715 of FIG. 11) so that a bias stress is applied onto each MIS capacitor light sensing element (e.g., MIS capacitor light sensing element 710 of FIG. 11). The applied bias stress results in charge trapping, which may be observed as a shift in the capacitance, as shown in FIG. 15. Subsequently, during a transmit light mode 815, light can be absorbed by the organic semiconductor, which causes photogenerated charges to recombine with the trapped charges. As a result, the capacitance shift may be reversed. The change in the capacitance of the MIS capacitor light sensing element 710 is an indicator of the capacitance shift.

Figure 16:
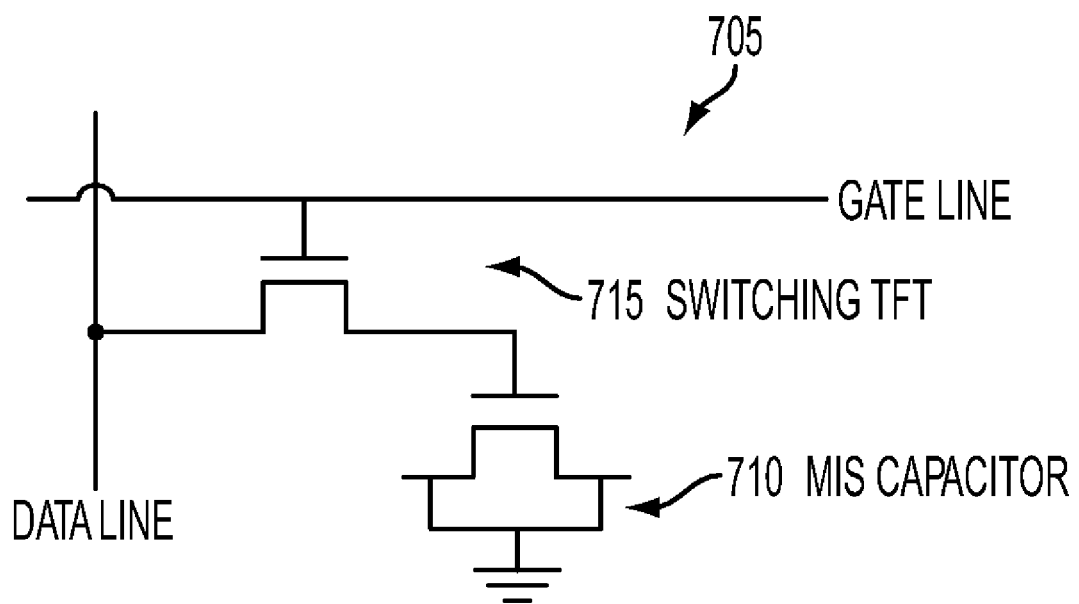
FIG. 16 shows a circuit diagram including an embodiment of a pixel including a MIS capacitor light sensing element and a switching TFT.

FIG. 16 shows a circuit diagram including an embodiment of the pixel 705 including the MIS capacitor light sensing element 705 and the switching TFT 715. A gate of the switching TFT 715 may be operatively coupled to a gate line. A source of the switching TFT 715 may be operatively coupled to a data line, and a drain of the switching TFT 115 may be operatively coupled to the MIS capacitor light sensing element 710. The operational characteristics including read/write and calibration cycles are later described with reference to FIG. 18.

Figure 17:
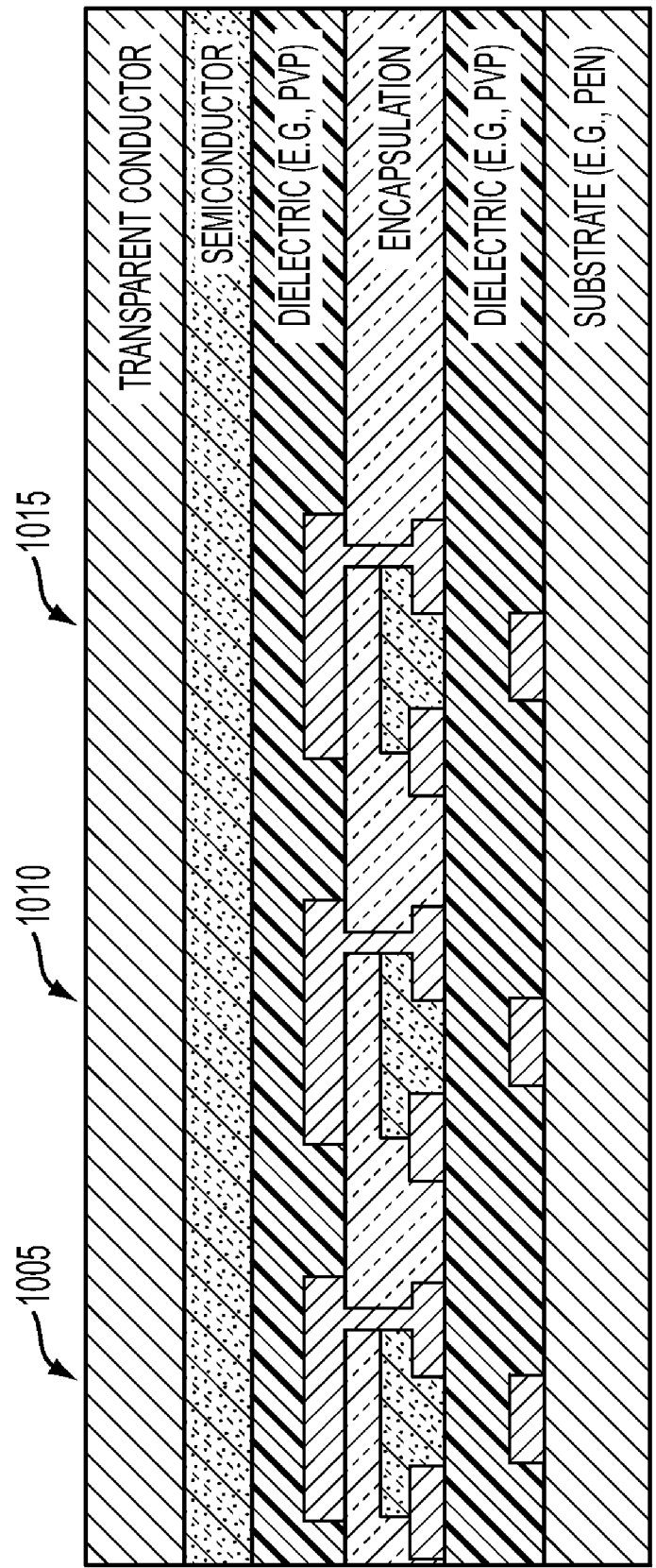
FIG. 17 shows an example layout of multiple light sensing elements, according to yet another embodiment of the present invention.

FIG. 17 shows an example layout of multiple light sensing elements 1005, 1010, and 1015, according to yet another embodiment of the present invention. Each light sensing element may have a light absorption range corresponding to one of (a) red color detection, (b) blue color detection, and (c) green color detection. In other words, a light absorption range can be varied to enable red-green-blue color detection by the light sensing elements without the need for color filters. Different polymers with different wavelength absorption characteristics can be used.

For example, three different semiconductors can be disposed in neighboring pixels to pattern an array of RGB light sensing elements. In one embodiment, the semiconductors can be inkjetted in the neighboring pixels. The pattern can then be grouped and replicated to form the charge map array (e.g., 145 or 745) using the RGB light sensing elements. Because the light absorption range can be varied, different levels of light absorption can correspond to different colors. The methods and devices described above apply equally as well to the case of RGB light sensing elements. In other words, the application of a bias stress to effectuate a value shift also applies in the case of RGB light sensing elements, with the added aspect of reading out different levels of value shifts for each of the red, green, and blue light sensing element groups, and comparing the value shift within each group. The light sensing elements 1005, 1010, and 1015 may be organic MIS capacitors or organic TFTs, or a combination of organic MIS capacitors and organic TFTs.

Figure 18:
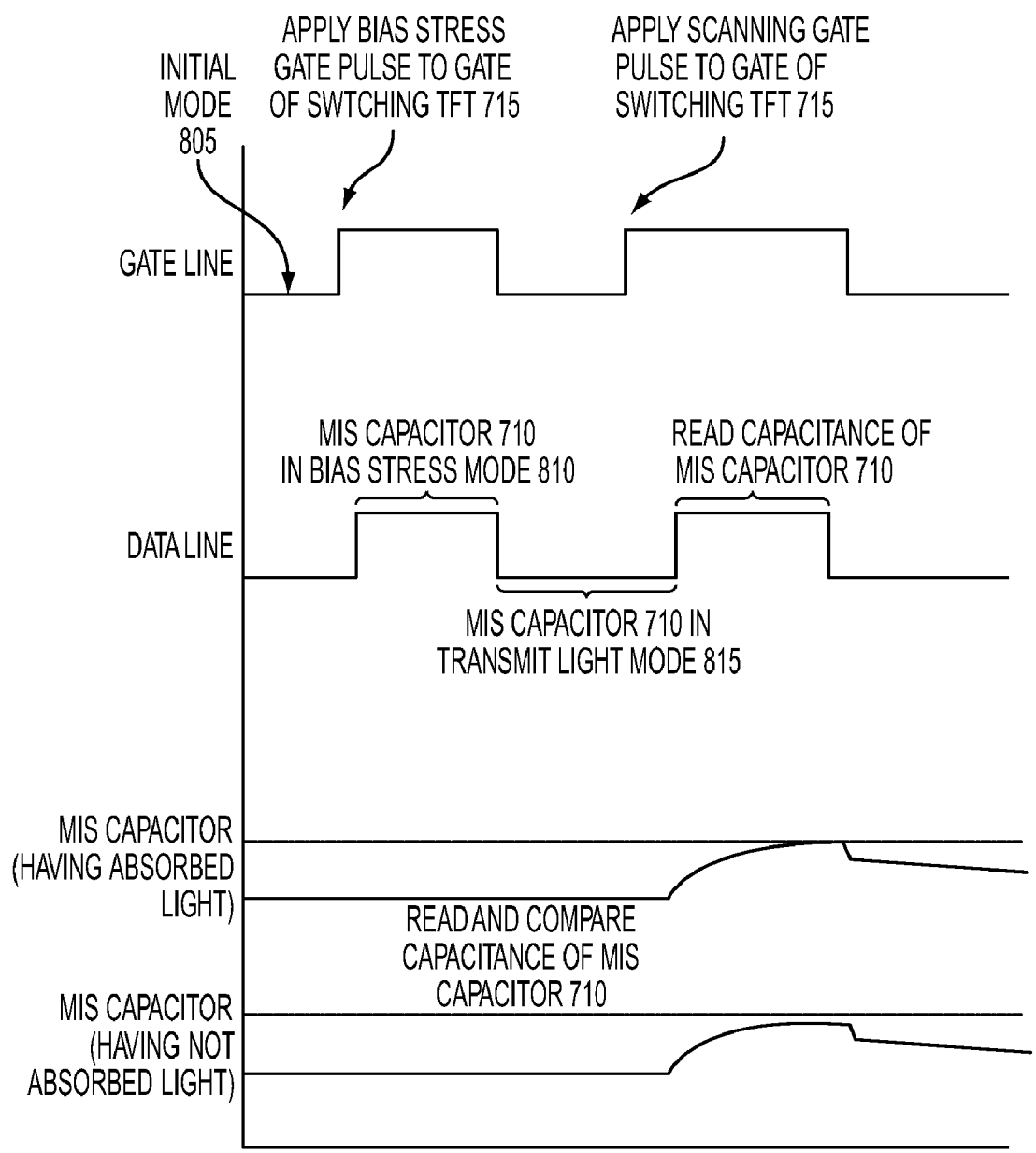
FIG. 18 shows a timing diagram of signals of a gate line and a data line associated with the operation of a MIS capacitor light sensing element as illustrated in FIG. 16.

FIG. 18 shows a timing diagram of signals associated with a gate line and a data line associated with the operation of a MIS capacitor light sensing element 710 as illustrated in FIG. 16.

A write cycle will first be described. At initial mode 805, both the gate line and the data line are at a low level. A bias stress gate pulse may then be applied over the gate line to a gate of switching TFT 115. In the bias stress mode 710, a bias stress pulse may be applied over the data line through the switching TFT 715, thereby pulsing the MIS capacitor light sensing element 710 to a high level. The bias stress pulse of the MIS capacitor light sensing element 710 may thereafter transition to a low level at the end of the pulse.

After the bias stress pulse of the MIS capacitor light sensing element 710 has transitioned to a low level, a transmission of light occurs. In other words, light may be transmitted toward the pixels of the charge map array 745 (of FIG. 12) between the write cycle and a read cycle.

A read cycle will now be described. A scanning gate pulse may be applied over the gate line to a gate of the switching TFT 715 and the capacitance of the MIS capacitor light sensing element 710 may be read to determine whether capacitance shift has occurred. In other words, a pixel having absorbed light will have a different capacitance value than a pixel having not absorbed light, as shown toward the bottom of FIG. 18.

While an operation of a pixel including MIS capacitor light sensing element 710 and switching TFT 715 is herein described, similar operations can be performed on a plurality of similarly situated pixels. A calibration operation may also be periodically performed on each of the pixels of the charge map array 745. The calibration operation may occasionally write fixed voltage values for calibration of signal decay and capacitance shift non-linearity.

The efficiency of embodiments of the present invention can be further improved by reducing semiconductor thickness to about 20 nm or less, which is the exciton diffusion length in most organic polymers. Materials besides organic semiconductors can be used as long as the recombination of trapped charges can be induced by light.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. A method for sensing light using a charge map array, comprising:
    applying a bias stress to a plurality of pixels in the charge map array, thereby trapping charge carriers in each of the plurality of pixels responsive to the bias stress;
    transmitting light toward the plurality of pixels in the charge map array, thereby releasing the trapped charge carriers in a first portion of the plurality of pixels responsive to transmitting the light;
    determining a threshold voltage shift in the first portion and a second portion of the plurality of pixels by applying a scanning gate pulse to a gate of a switching TFT of each of the plurality of pixels, and reading a current value from a TFT light sensing element of each of the plurality of pixels by applying a read voltage to a source of the switching TFT of each of the plurality of pixels to transfer a read gate voltage to the TFT light sensing element and reading the current value at a drain of the TFT light sensing element to determine the threshold voltage shift in each of the plurality of pixels; and
    comparing the threshold voltage shift in the first portion of the plurality of pixels to the threshold voltage shift in the second portion of the plurality of pixels.

2. The method of claim 1, wherein the transmitted light is not absorbed by the second portion of the plurality of pixels.

3. The method of claim 2, further comprising:
    determining which of the plurality of pixels in the charge map array absorbed the transmitted light based on the comparison of the value shift in the first and second portions of the plurality of pixels.

4. The method of claim 1, further comprising:
    displaying a charge-map image of the value shift of each of the plurality of pixels; and periodically calibrating each of the plurality of pixels.

5. The method of claim 1, wherein applying the bias stress to the plurality of pixels in the charge map array includes:
applying a bias stress gate pulse to a gate of a switching thin film transistor (TFT) of each of the plurality of pixels; and
applying a bias stress pulse to a source of the switching TFT to transfer a bias stress voltage to a light sensing element of each of the plurality of pixels.

6. A device, comprising:
a charge map array including a plurality of pixels, each pixel including a switching TFT and a light sensing TFT structured to absorb light;
a gate driver board coupled to the charge map array and structured to apply a bias stress to the plurality of pixels in the charge map array; and
a data sense board coupled to the charge map array and structured to determine a threshold voltage shift in a first portion and a threshold voltage shift in a second portions of the plurality of pixels responsive to a transmission of light toward the plurality of pixels in the charge map array, the data sense board include a comparator to compare a value shift in the first portion of the plurality of pixels to a value shift in the second portion of the plurality of pixels, the data sense board structured to:
apply a read voltage to a source of the switching TFT of each of the plurality of pixels to transfer a read gate voltage to the light sensing TFT;
apply a scanning gate pulse to a gate of the switching TFT of each of the plurality of pixels; and
read a current value from a drain of the light sensing TFT in each of the plurality of pixels,
compare the threshold voltage shift in the first portion of the plurality of pixels to the threshold voltage shift in the second portion of the plurality of pixels to determine which of the plurality of pixels in the charge map array absorbed the transmitted light.

7. The device of claim 6, wherein the first portion of the plurality of pixels absorbs the light and the second portion of the plurality of pixels does not absorb the light.

8. The device of claim 7, wherein the data sense board is structured to determine which of the plurality of pixels in the charge map array absorbed the transmitted light based on the comparison of the value shift in the first and second portions of the plurality of pixels.

9. The device of claim 6, wherein the data sense board is structured to transmit digital data to a display device, the digital data including the value shift in the first and second portions of the plurality of pixels.

10. The device of claim 6, wherein the gate driver board is structured to apply a bias stress gate pulse to a gate of the switching TFT of each of the plurality of pixels, and to apply a bias stress pulse to a source of the switching TFT to transfer a bias stress voltage to the light sensing element of each of the plurality of pixels.

* * * * *